United States Patent
Dong

(10) Patent No.: US 11,776,830 B2
(45) Date of Patent: Oct. 3, 2023

(54) CONTROL SYSTEM AND METHOD OF MACHINE AND HOST COMPUTER

(71) Applicant: BEIJING NAURA MICROELECTRONICS EQUIPMENT CO., LTD., Beijing (CN)

(72) Inventor: Xiangwei Dong, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 317 days.

(21) Appl. No.: 17/262,652

(22) PCT Filed: Jul. 22, 2019

(86) PCT No.: PCT/CN2019/097084
§ 371 (c)(1),
(2) Date: Jan. 22, 2021

(87) PCT Pub. No.: WO2020/029786
PCT Pub. Date: Feb. 13, 2020

(65) Prior Publication Data
US 2022/0277973 A1 Sep. 1, 2022

(30) Foreign Application Priority Data
Aug. 10, 2018 (CN) .......................... 201810908948.5

(51) Int. Cl.
*H01L 21/67* (2006.01)
*G05B 19/418* (2006.01)

(52) U.S. Cl.
CPC .. *H01L 21/67276* (2013.01); *G05B 19/41835* (2013.01); *G05B 2219/45031* (2013.01); *G05B 2219/45212* (2013.01)

(58) Field of Classification Search
CPC ........ H01L 21/67276; H01L 21/67063; G05B 19/41835; G05B 2219/45031;
(Continued)

(56) References Cited

U.S. PATENT DOCUMENTS

| 5,522,957 A | * | 6/1996 | Weling | ............... | H01J 37/32935 |
| | | | | | 148/DIG. 162 |
| 2002/0055804 A1 | * | 5/2002 | Betawar | ........... | G05B 19/41865 |
| | | | | | 700/121 |

(Continued)

FOREIGN PATENT DOCUMENTS

| CN | 102175826 A | 9/2011 |
| CN | 102270127 A | 12/2011 |

(Continued)

OTHER PUBLICATIONS

World Intellectual Property Organization (WIPO) International Search Report for PCT/CN2019/097084 dated Oct. 28, 2019 7 Pages (including translation).

*Primary Examiner* — Kidest Bahta
(74) *Attorney, Agent, or Firm* — ANOVA LAW GROUP, PLLC

(57) ABSTRACT

The present disclosure provides a host computer, and a control system and method of a machine. The host computer includes a control unit, a service configuration unit, and a functional flow unit. The control unit is configured to control a lower level computer to execute items of a functional flow of the machine. The service configuration unit is configured with action instruction information used to execute the functional flow of the machine and configured to interact with the control unit. The functional flow unit stores items of the functional flow of the machine edited by a user and is configured to interact with the control unit. A technical solution of the host computer and the control system and method of the machine may realize an editable function of (Continued)

the functional flow of the machine to improve flexibility, convenience, and a degree of automation of addition/modification of the functional flow.

9 Claims, 2 Drawing Sheets

(58) Field of Classification Search
CPC .......... G05B 2219/45212; G05B 2219/23258; G05B 2219/23304; G05B 2219/32142; G05B 19/042; G05B 19/0423; G05B 19/418; Y02P 90/02
See application file for complete search history.

(56) References Cited

U.S. PATENT DOCUMENTS

| | | | |
|---|---|---|---|
| 2005/0228523 A1* | 10/2005 | Heminway | G05B 19/41865 700/99 |
| 2009/0217151 A1* | 8/2009 | Wake | G06F 16/9027 715/256 |
| 2010/0142769 A1 | 6/2010 | Hirota | |
| 2018/0121202 A1 | 5/2018 | Chen et al. | |

FOREIGN PATENT DOCUMENTS

| | | |
|---|---|---|
| CN | 103192389 A | 7/2013 |
| CN | 105955726 A | 9/2016 |
| CN | 106736071 A | 5/2017 |
| CN | 106959674 A | 7/2017 |
| CN | 107045326 A | 8/2017 |
| CN | 107122285 A | 9/2017 |
| CN | 107168133 A | 9/2017 |
| CN | 107340995 A | 11/2017 |
| JP | 2005141699 A | 6/2005 |
| JP | 2008310799 A | 12/2008 |
| JP | 2011198237 A | 10/2011 |
| JP | 2016207088 A | 12/2016 |

* cited by examiner

CONTROL SYSTEM AND METHOD OF MACHINE AND HOST COMPUTER

CROSS-REFERENCES TO RELATED APPLICATIONS

This application is a national phase entry under 35 U.S.C. § 371 of International Application No. PCT/CN2019/097084, filed on Jul. 22, 2019, which claims priority to Chinese Application No. 201810908948.5 filed on Aug. 10, 2018, the entire content of all of which are incorporated herein by reference.

TECHNICAL FIELD

The present disclosure generally relates to the machine control field and, more particularly, to a host computer, and a control system and method of a machine.

BACKGROUND

In the information age, information technology develops rapidly, various electronic devices are developed, which satisfies human's real life needs, and at the same time, pushes forward the development of the semiconductor industry greatly. Such development imposes higher requirements for semiconductor etching equipment.

In an application of an etching machine, various functions are included, such as chamber leakage ratio inspection, manually performing dry cleaning, etc. Specific content or internal flows of these work functions are all set into a control software of the etching machine. For a certain function of the machine, an execution manner of the function is defined by a lower level computer of the machine in a manner of a work flow. Then, the lower level computer provides the work flow as a service for a host computer to access. The host computer then designs a specific operation interface for a user to execute the work flow.

However, when the machine is updated or the process is changed, the control software of the machine needs to be updated correspondingly to ensure a normal application of the machine. Moreover, the whole machine cannot be operating normally until the software update is complete. The update process thus delays the time of realizing the updated function and wastes manpower and time.

SUMMARY

The present disclosure aims to at least solve one of the technical problems in the existing technology and provides a host computer and a control system and method of a machine. The host computer and the control system and method of the machine may realize an editable function of a functional flow of the machine to improve flexibility, convenience, and a degree of automation of addition/modification of the functional flow of the machine. As such, manpower and time cost may be saved.

To realize the purpose of the present disclosure, a host computer is provided. The host computer includes a control unit, a service configuration unit, and a functional flow unit. The control unit is configured to control a lower level computer to execute items of a functional flow of a machine. The service configuration unit is configured with action instruction information used to execute the functional flow of the machine and configured to interact with the control unit. The function flow unit stores items of the functional flow of the machine edited by a user and is configured to interact with the control unit.

In some embodiments, the host computer further includes an automatic editing unit. The automatic editing unit is configured to interact with the service configuration unit through the automatic editing unit.

In some embodiments, the host computer further includes an automatic management unit. The automatic management unit is configured to interact with the functional flow unit through the automatic management unit.

In some embodiments, a format of a storage file of the functional flow unit includes XML; and/or a format of a configuration file of the service configuration unit includes XML.

As another technical solution, the present disclosure further provides a control system of a machine, including a host computer provided by the present disclosure and a lower level computer. The lower level computer is configured to receive service and parameters of the service transmitted by the host computer and execute items of a functional flow of the machine according to the service and the parameters.

As another technical solution, the present disclosure further provides a control method of a machine. A host computer provided by the present disclosure is used to edit a functional flow of the machine. The control method of the machine includes:

editing items of the functional flow of the machine item by item according to action instruction information configured with a service configuration unit and used to execute the functional flow of the machine;

storing edited items of the functional flow of the machine in a functional flow unit; and starting the functional flow unit and causing a control unit to control a lower level computer to execute the stored items of the functional flow of the machine when needed.

In some embodiments, after editing the items of the functional flow of the machine item by item according to the action instruction information configured with the service configuration unit and used to execute the functional flow of the machine, and before storing edited items of the functional flow of the machine in a functional flow unit, the control method of the machine further includes:

setting a time interval between adjacent items of the functional flow of the machine.

In some embodiments, the items of the functional flow of the machine include an action instruction service and/or a logic instruction; and the logic instruction is used to control an execution sequence, execution time, and/or an execution condition of the functional flow of the machine.

In some embodiments, the logic instruction includes a wait instruction, when the functional flow of the machine is executed to the wait instruction, a next item is executed after waiting for determined time; or when the functional flow of the machine is executed to the wait instruction, whether the execution condition is satisfied is determined, or whether wait time reaches the determined time is determined, if yes, the next item is executed.

In some embodiments, the logic instruction further includes a cycle start instruction and a cycle end instruction;

when the functional flow of the machine is executed to the cycle start instruction, items between the cycle start instruction and the cycle end instruction are automatically and cyclically executed for a predetermined time; or when the functional flow of the machine is executed to the cycle start instruction, whether the execution condition is satisfied is determined, if yes, the items between the cycle start instruction and the cycle end instruction are executed cyclically for the predetermined time.

In some embodiments, the logic instruction further includes a start instruction and an end instruction;

when the functional flow of the machine is executed to the start instruction, whether the execution condition is satisfied is determined, if yes, items between the start instruction and the end instruction are executed; if not, the items between the start instruction and the end instruction are not executed; or the logic instruction further includes the start instruction, a middle instruction, and the end instruction; and when the functional flow of the machine is executed to the start instruction, whether the execution condition is satisfied is determined, if yes, items between the start instruction and the middle instruction are executed, and items between the middle instruction and the end instruction are not executed; if not, the items between the middle items and the end instruction are executed, and the items between the start instruction and the middle instruction are not executed.

The present disclosure includes the following beneficial effects.

In the technical solution that the present disclosure provides the host computer and the control system and method of the machine, the host computer includes a control unit, a service configuration unit, and a functional flow unit. The control unit is configured to control a lower level computer to execute items of a functional flow of a machine. The service configuration unit is configured with action instruction information used to execute the functional flow of the machine and configured to interact with the control unit. The function flow unit stores items of the functional flow of the machine edited by a user and is configured to interact with the control unit. An operator may choose to use a function needed for editing the action instruction information of the functional flow of the machine and provided by the service configuration unit, that is, an addition of the function is completed. When an edited function needs to be executed, only the functional flow unit and a corresponding operation button need to be started to directly execute the edited function. As such, the host computer provided by the present disclosure may be configured to realize the editable function of the functional flow of the machine to improve the flexibility, the convenience, and the degree of automation of the addition/modification of the functional flow of the machine. Thus, the manpower and time cost may be saved.

DETAILED DESCRIPTION OF THE EMBODIMENTS

To make those skilled in the art better understand technical solutions of the present disclosure, a host computer, and a control system and method of a machine consistent with the present disclosure are described in detail in connection with the accompanying drawings.

Figure 1:
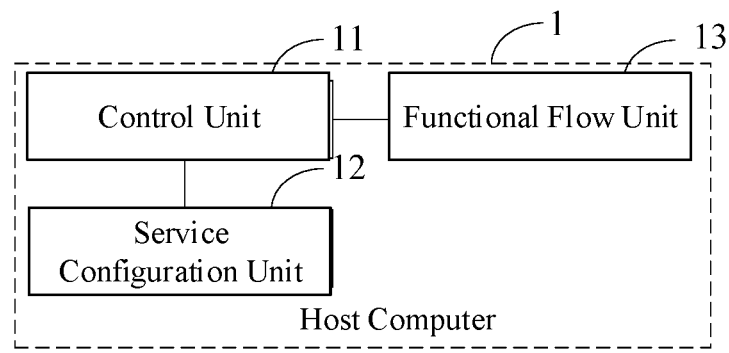
FIG. 1 is a schematic block diagram showing a principle of a host computer according to some embodiments of the present disclosure.

Referring to FIG. 1, a host computer 1 consistent with embodiments of the present disclosure includes a control unit 11, a service configuration unit 12, and a functional flow unit 13. The control unit 11 may be configured to control a lower level computer to execute items of a functional flow. The items of the functional flow may include various steps needed for completing the process.

The service configuration unit 12 may be configured with action instruction information used to execute the functional flow of the machine and may be configured to interact with the control unit 11. An operator may select to use a function provided by the service configuration unit 12 needed for editing action instruction information of the functional flow of the machine, that is, an addition of the function is completed.

The action instruction information may include an advance action instruction service and a basic action instruction service, and further include a simple logic instruction and related parameters. As such, the operator may edit a basic function, an advanced function, and/or the simple logic instruction according to the action instruction information. Thus, the addition of the function of the machine may be more flexible and easy to expand.

In some embodiments, a format of a configuration file of the service configuration unit 12 may include XML. Of course, another format that can store data may also be used.

Figure 2:
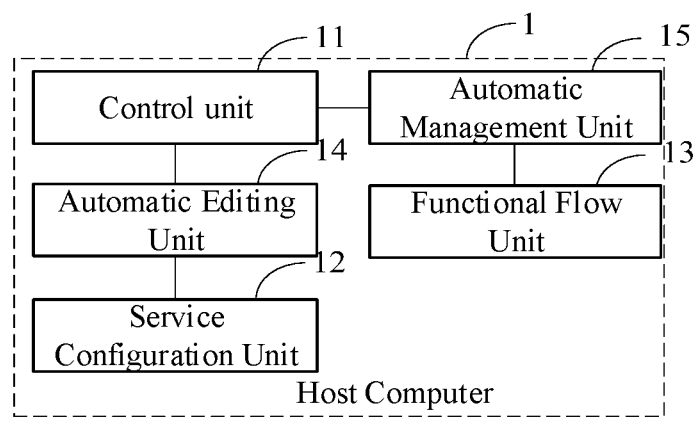
FIG. 2 is a schematic block diagram showing another principle of a host computer according to some embodiments of the present disclosure.

In some embodiments, as shown in FIG. 2, the host computer further includes an automatic editing unit 14. The control unit 11 may interact with the service configuration unit 12 through the automatic editing unit 14. The automatic editing unit 14, for example, may be referred to as a class named AutoProConfig (a code template).

The function flow unit 13 may store the items of the functional flow of the machine edited by the user and may be configured to interact with the control unit 11. When an edited function needs to be executed, the edited function may be directly executed by starting the functional flow unit 13 and clicking a corresponding operational button.

In some embodiments, the host computer 1 further includes an automatic management unit 15. The control unit 11 may interact with the functional flow unit 13 through automatic management unit 15. The automatic management unit 15, for example, may be referred to as a class named AutoProManager (a code template).

In some embodiments, a format of a storage file of the functional flow unit 13 may include XML. Of course, another format that can store the data may also be used.

Thus, the host computer consistent with embodiments of the present disclosure may realize an editable function of the functional flow of the machine to increase flexibility, convenience, and a degree of automation of the addition/modification of the functional flow of the machine to save the manpower and the time cost.

Figure 3:
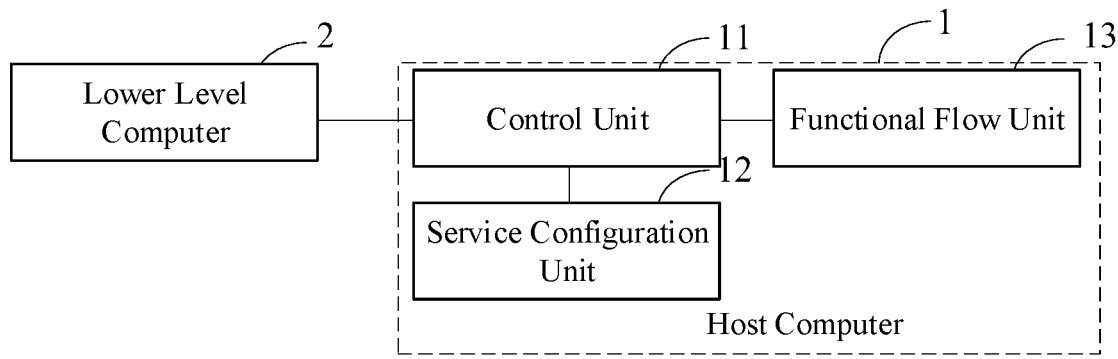
FIG. 3 is a schematic block diagram showing a principle of a control system of a machine according to some embodiments of the present disclosure.

As another technical solution, with reference to FIG. 3, embodiments of the present disclosure further provide a control system of the machine, which includes a host computer 1 and a lower level computer 2. The host computer 1 includes the above-described host computer consistent with embodiments of the present disclosure. The lower level computer 2 may be configured to directly control the machine to work and obtain a condition of the machine. The lower level computer 2 may generally include a programmable logic controller (PLC) or a microcontroller unit (MCU). Various actions in the lower level computer 2 may be accessible for the host computer 1 in forms of services for the host computer 1 to access.

In some embodiments, the host computer 1 may be configured to control the lower level computer 2 by sending the services (i.e., action instructions) and the parameters of the services to the lower level computer 2. When receiving the services and the parameters of the services sent by the host computer 1, the lower level computer 2 may execute the items of the functional flow of the machine.

The control system of the machine provided by the present disclosure may be configured to realize the editable function of the functional flow of the machine by using the host computer 1 and the lower level computer 2 provided by embodiments of the present disclosure. Thus, the flexibility, the convenience, and the degree of the automation of the addition/modification of the functional flow of the machine may be increased to save manpower and time cost.

Figure 4:
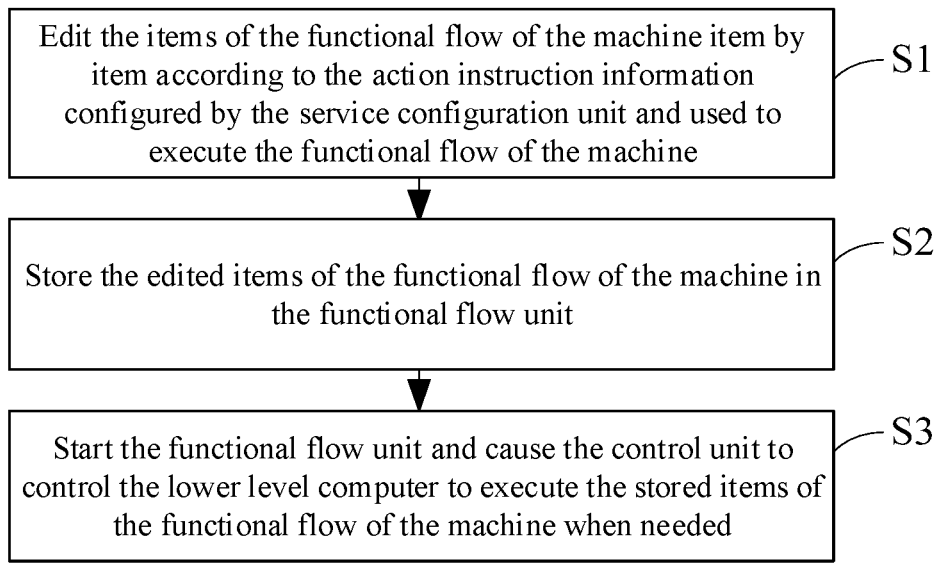
FIG. 4 is another schematic flow block diagram of a control method of a machine according to some embodiments of the present disclosure.

As another technical solution, with reference to FIG. 4, embodiments of the present disclosure further provide a control method of the machine, which uses the host computer 1 provided by embodiments of the present disclosure to edit the functional flow of the machine.

The control method of the machine includes:
- at S1, editing the items of the functional flow of the machine item by item according to the action instruction information configured by the service configuration unit 12 and used to execute the functional flow of the machine;
- at S2, storing the edited items of the functional flow of the machine in the functional flow unit 13; and
- at S3, starting the functional flow unit 13 and causing the control unit 11 to control the lower level computer 2 to execute the stored items of the functional flow of the machine when needed.

The control method of the machine provided by embodiments of the present disclosure may edit the functional flow of the machine by using the host computer provided by embodiments of the present disclosure. As such, the flexibility, the convenience, and the degree of the automation of the addition/modification of the functional flow of the machine may be increased. Further, the manpower and the time cost may be saved.

In some embodiments, the item of the functional flow of the machine may include an action command service. The action command service may include a basic action instruction service or an advanced action instruction service.

In practical applications, the operator may choose to use the basic action command service provided in the service configuration unit 12 to edit the required basic function. After the operator determines to start editing the basic function, the control unit 11 may request the operator to edit the flow content of the basic function item by item. After editing, the operator may store the edited function flow in the functional flow unit 13 and may start the functional flow unit 13 to execute the functional flow when needed.

According to the method, the edition of the basic function flow may be completed. Meanwhile, an edited basic function may be further used as an independent advanced action instruction service for the operator to edit an advanced function with the basic action instruction service. In some embodiments, after the operator determines to start editing the advanced function, the control unit 11 may request the operator to edit the flow content of the advanced function item by item. After editing, the operator may store the edited function flow in the functional flow unit 13 and may start the functional flow unit 13 to execute the functional flow when needed.

As such, the control method of the machine provided by embodiments of the present disclosure may include editing the basic function and the advanced function of the machine by using the host computer provided by embodiments of the present disclosure. Thereby, the addition of the machine function may be more flexible and easy to expand.

In practical applications, the operator may choose the basic action instruction service or the advanced action instruction service in a specific functional type range according to the production needs and determine the required parameters in a reasonable range.

In addition, during a process of executing the edited functional flow, the operator may change a certain flow content that is not executed simultaneously. The operator may determine whether a certain item of the functional flow that is currently executed needs to be executed according to the execution status of the items to satisfy needs of some productions or experiments.

In some embodiments, after process S1 and before the process S2, the control method of the machine may further include:
- setting a time interval between adjacent items of the functional flow of the machine.

As such, when editing the items of the functional flow of the machine item by item, the operator may set the time interval between the items.

When adding a certain item of the functional flow, besides the advanced action instruction service and the basic action instruction service provided by the system may be added, the added item may further include a simple logic instruction provided by the system. As such, a simple logic operation similar to a programming language may be realized based on sequential execution of the flow.

In some embodiments, the item of the functional flow of the machine may further include the logic instruction. The logic instruction may be used to control the execution sequence, the execution time, and/or the execution condition of the functional flow of the machine.

For example, the logic instruction may include a wait instruction (waitfor). When the functional flow of the machine is executed to waitfor, a next item may be executed after waiting for a determined time.

Or, when the functional flow of the machine is executed to waitfor, whether the execution condition is satisfied or the wait time is reached the determined time may be determined. If the execution condition is satisfied or the wait time is reached, a next item may be executed.

For another example, the logic instruction may further include a cycle start instruction (whilestart) and a cycle end instruction (whilestop). When the function flow of the machine is executed to whilestart, the items between whilestart and whilestop may be automatically executed for a predetermined time.

Or, when the functional flow of the machine is executed to whilestart, whether the execution condition is satisfied may be determined. If the execution condition is satisfied, the items between whilestart and whilestop may be executed for a predetermined time.

For another example, the logic instruction may further include a start instruction (ifstart) and an end instruction (ifstop).

When the functional flow of the machine is executed to ifstart, whether the execution condition is satisfied may be determined. If the execution condition is satisfied, the items between ifstart and ifend may be executed; and if the execution condition is not satisfied, the items between ifstart and ifend may not be executed.

For a further example, the logic instruction may further include ifstart, a middle instruction (else), and ifstop.

When the function flow of the machine is executed to ifstart, whether the execution condition is satisfied may be determined. If the execution condition is satisfied, the items between ifstart and else may be executed, and the items between else and ifend may not be executed. If the execution condition is not satisfied, the items between else and ifend may be executed, and the items between ifstart and else may not be executed.

The present disclosure includes but is not limited to the logic instructions listed as examples above, and may further include logic instructions commonly used in editing the flow.

An embodiment of the functional flow of the machine is described in detail below. Specifically, the functional flow includes the following items:

Item 1, Pendulum Valve, Set Position, position=1000;
Item 1 means that the service of the lower level computer is called to set a position value of Pendulum Valve to 1000.
Item 2, ifstart, condition: Helium Valve DO=Close||Helium Valve2 DO=Close;
Item 3, OpenValve, valveId=HeValve1;
Item 4, OpenValve, valveId=HeValve2;
Item 5, ifstop;
Item 2 to Item 5 mean that if any valve of HeValve 1 or HeValve 2 is closed, valve opening services of the two valves are executed.
Item 6, Temp Ctl SetTemp, pos=top, temp=60;
Item 6 means that a temperature of top position is set to 60° C.
Item 7, waitfor, waittime=1000 ms;
Item 7 means that time of waiting for raising the temperature is 1000 ms.
Item 8, whilestart, condition: TCTemp<60, timeout=60000 ms;
Item 9, waitfor, waittime=1000 ms;
Item 10, whilestop;
Item 8 to Item 10 form a cycle. Whether the temperature of a top position reaches 60° C. is cyclically determined, if the temperature of the top position does not reach 60° C., the system continues to wait 1000 ms. An excessive time is set simultaneously, if the temperature does not reach 60° C. after 60000 ms, then, the system jumps out of the cycle between Item 8 and Item 10 to continue to execute downward.
Item 11, TempCtl_SetTemp, pos=middle1, temp=40;
Item 11 means to set the temperature of middle 1 position to 40° C.
Item 12, waitfor, waittime=20000 ms;
Item 12 means that the wait time for the temperature to rise is 20000 ms.
Item 13, ifstart, condition: MC1Temp<40;
Item 14, OpenValve, valveId=FastRough;
Item 15, else;
Item 16, OpenValve, valveId=SlowRough;
Item 17, ifstop;
Item 18, CloseValve, valveId=HeValve1;
Item 13 to Item 18 form a conditional determination, if the temperature of middle 1 position does not reach 40° C., the valve of FastRough may be opened, otherwise the valve of SlowRough may be opened. Item 18 means to close the valve of HeValve 1.

In some embodiments, for an abnormal situation during the flow execution, if the abnormal situation includes a lower level alarm that may not affect the operation result of the machine, the host computer may process the alarm automatically and continue to execute, and a manual interference may not be needed. If the abnormal situation includes a higher level alarm that may affect the operation of the machine, the host computer may send a warning to inform the operator to remind the operator to process it to restore the execution of the flow.

It can be understood that the above embodiments are merely exemplary embodiments for describing the principle of the present disclosure. However, the present disclosure is not limited to these embodiments. For those of ordinary skill in the art, various variations and improvements may be made without departing from the spirit and essence of the present disclosure. These variations and improvements are also within the scope of the present disclosure.

What is claimed is:

1. A control method of an etching machine, comprising:
   editing a functional flow of the etching machine by using a host computer;
   editing items of the functional flow of the etching machine item by item according to action instruction information configured with a service configuration circuit and used to execute the functional flow of the etching machine;
   setting a time interval between adjacent items of the functional flow of the etching machine after editing the items of the functional flow and before storing the edited items;
   storing edited items of the functional flow of the etching machine in a functional flow circuit; and
   starting the functional flow circuit and causing a control circuit to control a lower level computer to execute the stored items of the functional flow of the etching machine when needed.

2. The method according to claim 1, wherein:
   the items of the functional flow of the etching machine include an action instruction service and a logic instruction; and
   the logic instruction is used to control an execution sequence, execution time, and an execution condition of the functional flow of the etching machine.

3. The method according to claim 2, wherein:
   the logic instruction includes a wait instruction, when the functional flow of the etching machine is executed to the wait instruction, a next item is executed after waiting for determined time; or
   when the functional flow of the etching machine is executed to the wait instruction, whether the execution condition is satisfied is determined, or whether wait time reaches the determined time is determined, if yes, the next item is executed.

4. The method according to claim 2, wherein:
   the logic instruction further includes a cycle start instruction and a cycle end instruction;
   when the functional flow of the etching machine is executed to the cycle start instruction, items between the cycle start instruction and the cycle end instruction are automatically and cyclically executed for a predetermined time; or
   when the functional flow of the etching machine is executed to the cycle start instruction, whether the execution condition is satisfied is determined, if yes, the items between the cycle start instruction and the cycle end instruction are executed cyclically for the predetermined time.

5. The method according to claim 2, wherein:

the logic instruction further includes a start instruction and an end instruction; and when the functional flow of the etching machine is executed to the start instruction, whether the execution condition is satisfied is determined, if yes, items between the start instruction and the end instruction are executed; if not, the items between the start instruction and the end instruction are not executed; or the logic instruction further includes the start instruction, a middle instruction, and the end instruction; and when the functional flow of the etching machine is executed to the start instruction, whether the execution condition is satisfied is determined, if yes, items between the start instruction and the middle instruction are executed, and items between the middle instruction and the end instruction are not executed; if not, the items between the middle items and the end instruction are executed, and the items between the start instruction and the middle instruction are not executed.

6. The control system according to claim 1, wherein:

a format of a storage file of the functional flow circuit includes XML; and a format of a configuration file of the service configuration circuit includes XML.

7. A host computer for a control system of an etching machine, configured to perform the control method according to claim 1.

8. A control system of an etching machine, comprising:

a host computer, configured to perform the control method according to claim 1, and a lower level computer configured to receive service and parameters of the service sent from the host computer and execute items of the functional flow of the etching machine according to the service and the parameters.

9. A control method of an etching machine, configured to edit a functional flow of the etching machine by using a host computer, comprising:

editing items of the functional flow of the etching machine item by item by executing the functional flow of the etching machine;

storing edited items of the functional flow of the etching machine; and controlling a lower level computer to execute the stored items of the functional flow of the etching machine when needed, wherein:

the items of the functional flow of the etching machine include an action instruction service and a logic instruction; and the logic instruction is used to control an execution sequence, execution time, and an execution condition of the functional flow of the etching machine.

* * * * *